Sept. 15, 1959 G. RASMUSSEN 2,904,768

CIRCUIT CONNECTOR FOR PRINTED CIRCUIT BOARDS

Filed April 13, 1955 3 Sheets-Sheet 1

GEORGE RASMUSSEN
INVENTOR.

BY Henry Heyman
ATTORNEY

CIRCUIT CONNECTOR FOR PRINTED CIRCUIT BOARDS

Filed April 13, 1955 3 Sheets-Sheet 2

GEORGE RASMUSSEN
INVENTOR.

BY Henry Heyman
ATTORNEY

Sept. 15, 1959 G. RASMUSSEN 2,904,768
CIRCUIT CONNECTOR FOR PRINTED CIRCUIT BOARDS
Filed April 13, 1955 3 Sheets-Sheet 3

GEORGE RASMUSSEN
INVENTOR.

BY Henry Heyman

ATTORNEY

United States Patent Office 2,904,768 Patented Sept. 15, 1959

2,904,768

CIRCUIT CONNECTOR FOR PRINTED CIRCUIT BOARDS

George Rasmussen, Norwalk, Calif., assignor to Hughes Aircraft Company, Culver City, Calif., a corporation of Delaware Application April 13, 1955, Serial No. 501,049

4 Claims. (Cl. 339—17)

This invention has general utility in the field of electrical circuits and interconnections between such circuits, and relates specifically to a circuit connector adapted for use in conjunction with printed or etched circuitry.

In various electrical and electronic devices employing printed circuits or the like types of circuit patterns, considerable difficulty is experienced in connection with the necessity for interconnecting one electrical or electronic component with another, or for permitting attachment thereof to adjacent plugs, sockets or other connector arrangements.

In mass production techniques, it is not always possible to obtain solder connections in which optimum current carrying capacity is maintained or wherein the connection is of such a characteristic as to avoid breakdown under vibration or other detrimental conditions. Additionally, in order that the cost of complex electrical and electronic devices may be maintained as low as possible, it is important that production techniques be used that will most efficiently rigidly or releasably connect various components in as short a period of time as possible, by elimination of many of the usual and heretofore known manual operations.

Heretofore, it has been the usual practice to affix a plurality of eyelets at various positions in a printed circuit pattern and thereafter to solder leads, from connector plugs, to the circuit by way of such eyelets. Thus, several soldered connections were necessary, which not only took a considerable period of time in assembly, but also possessed the above mentioned inherent disadvantages of such soldered connections. Furthermore, when interconnecting one printing circuit board or plate with an adjacently disposed similar board or plate, it has been necessary to utilize some means to provide a reliable contact arrangement that would serve to engage printed circuit strips on the board, with such contact arrangement necessarily having to be soldered or otherwise connected by separate wires or other printed circuit boards.

In still other instances, prior art devices have employed, through necessity, exposed printed circuit board interconnecting structure which was, of course, susceptible to damage in the event of contact with various adjacent objects.

Accordingly, it is one important object of the present invention to provide a novel circuit connector.

It is another important object of the present invention to provide a novel circuit connector wherein the major portion of usually soldered connections are eliminated.

It is a further important object of the present invention to provide a novel circuit connector including unitary integral strip contact means which may assume a variety of configurations to provide any particular interconnecting arrangement necessary as between a plurality of printed circuit boards or other structures.

Still another important object of the present invention is to provide a device for interconnecting various printed circuit components and/or cable leads, wherein a minimum amount of space is utilized, more efficiency and reliably maintained and wherein the time necessary for assembly of the device is considerably less than heretofore.

It is a still further important object of the present invention to provide a circuit connector that may be utilized in a relatively small space envelope.

A further important object of the present invention is to provide a circuit connector having integral cable attachment means formed as a portion of a connector element and requiring no soldered interconnection with such element.

Other and further important objects of the present invention will become apparent from the disclosures in the following detailed specification, appended claims and accompanying drawings, wherein:

Figures 1, 2, 3:
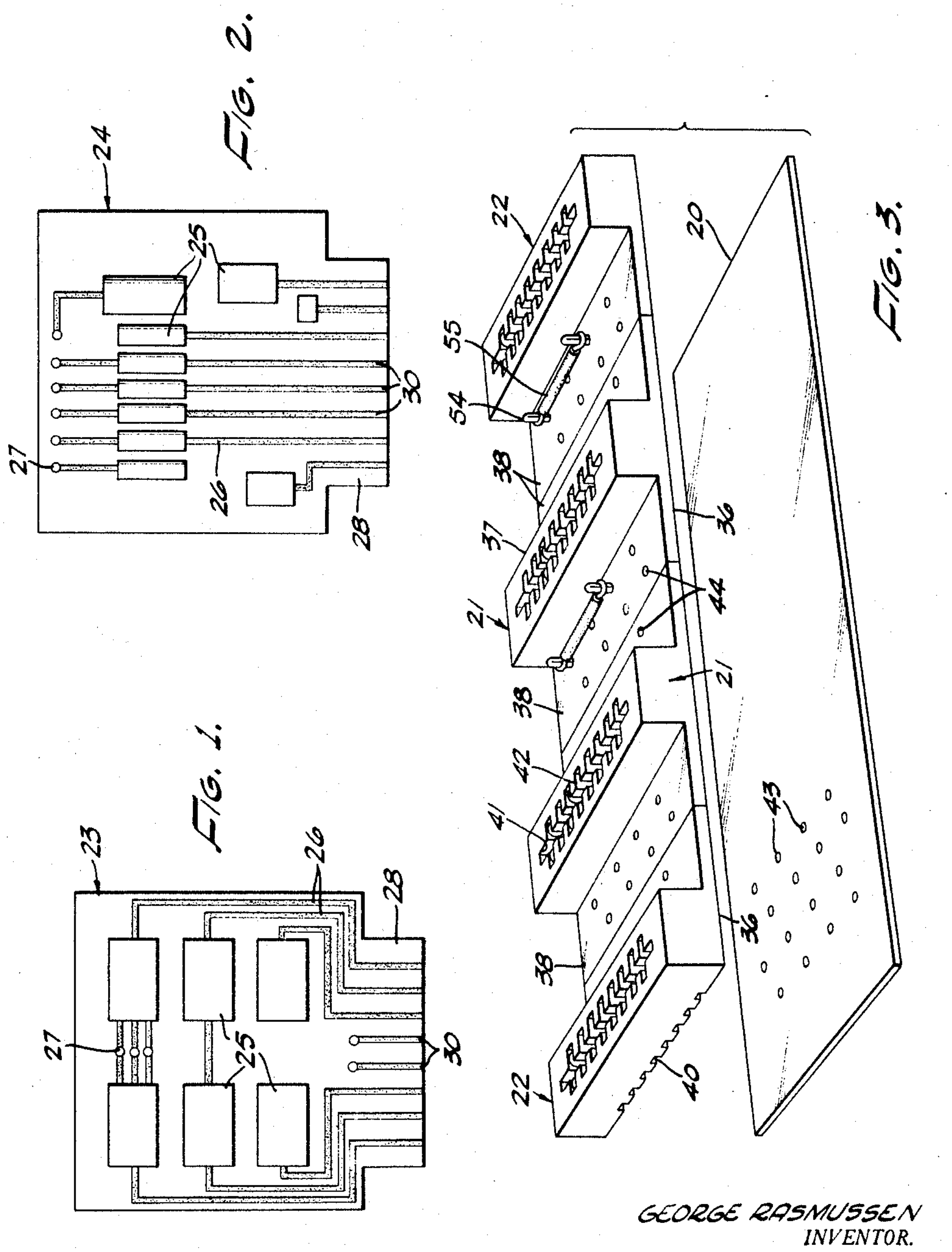
Figure 1 is a front elevational view of one type of board and printed circuit arrangement that may be employed with the circuit connector or the present invention.
Fig. 2 is another exemplary board and printed circuit arrangement.
Fig. 3 is an exploded isometric view of the present circuit connector.
Figures 4, 5:
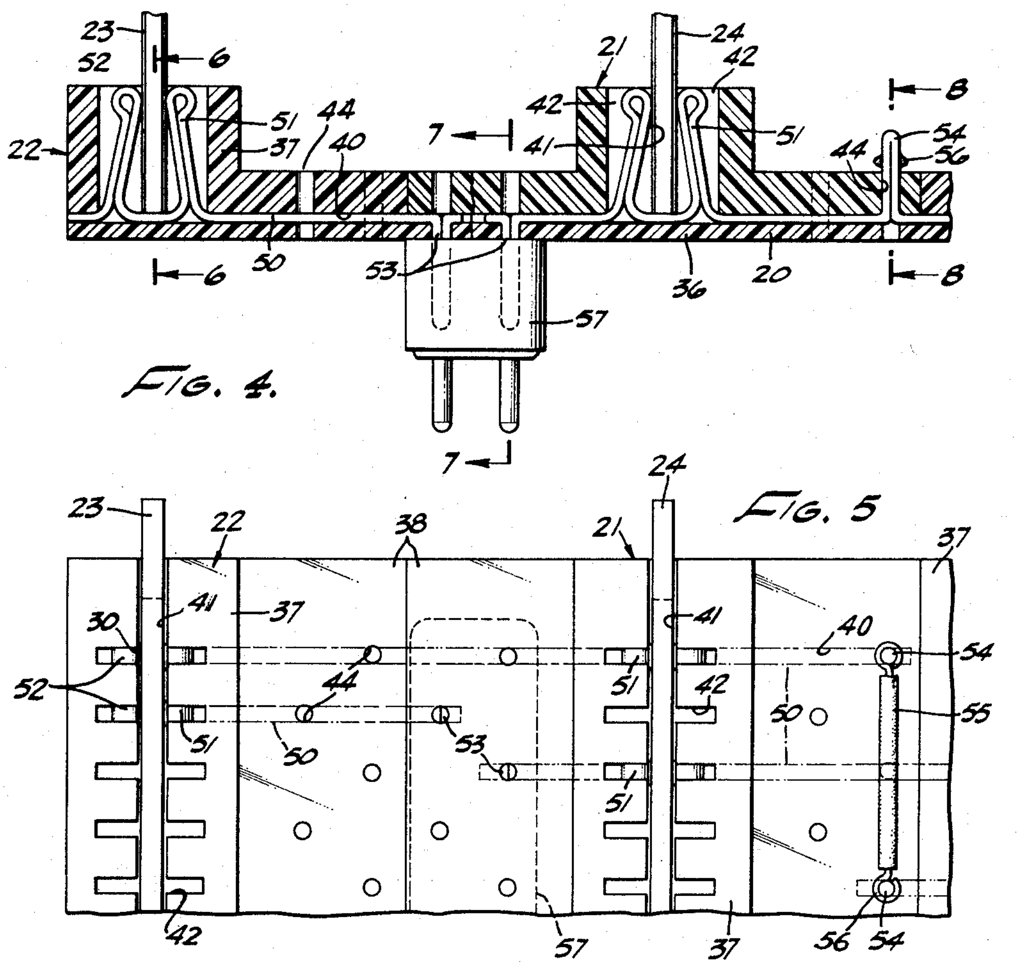
Fig. 4 is an enlarged fragmentary sectional view taken transversely through the present circuit connector.
Fig. 5 is an enlarged fragmentary top plan view of the connector.

With reference to the drawings, and referring primarily to Figs. 3, 4 and 5, the circuit connector of the present invention comprises generally a base plate member 20 on which are arranged a plurality of contact supporting structures 21 and 22. The contact supporting structures 21 and 22 are slightly different in configuration, the structures 21 being used in the central area of the assembly and the structures 22 being employed on ends of the assembly. Details of the structures 21 and 22 will be described hereinafter. The circuit connector is intended for use primarily in connection with printed circuit boards shown by way of examples at 23 and 24 in Figs. 1 and 2 respectively. Each of the boards 23 and 24 is adapted to carry a plurality of electrical or electronic components 25 that are interconnected by means of printed circuit strips 26 and suitable eyelet arrangements 27. The boards 23 and 24 have projecting portions 28 onto which all of the printed strips 26 extend, as at 30. Thus, a plurality of spaced contact areas are provided along the outer edge of the projecting portions 28. Obviously, the boards 23 and 24 may be printed on both sides if desired without departing from the spirit and scope of the present invention. Accordingly, therefore, the present invention is adapted for use as a means to provide selective interconnection between the circuitry employed on one of the boards, as for example board 23, with the circuitry on another of the boards, as for example board 24.

Figure 11:
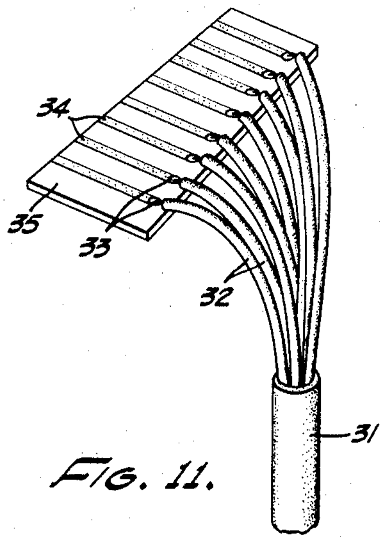
Fig. 11 is an isometric view showing a type of cable connector that may be employed herewith.

Additionally, as shown in Fig. 11, the present device may be employed as a means to provide connection between a board and a multi-lead cable, as indicated at 31. In this instance, various leads 32 of the cable 31 are connected by means of eyelets 33 to printed circuit strips or contacts 34 carried by a relatively small circuit board 35.

For simplicity of illustration and comprehension of the present invention, the circuit connector hereof will be illustrated and described with but a portion of the possible connector elements in position, it being understood that various connector configurations may be employed in the present device, with all or a portion of the connector spaces provided being utilized as desired, without departing from the spirit and scope hereof. It is further to be understood that the particular arrangements of the interconnected printed circuit boards, the number of such boards employed and the specific number of possible connections, are by way of example only, and may be adjusted or modified to suit particular installational situations.

As shown in Figs. 3 and 4, the base plate member 20 may be made from any suitable relatively thin sheet of insulating material such as, for example, plastic, synthetic resin, glass, fiber, rubber or the like. The contact supporting structures 22 have a planar surface 36 and outwardly extending projections 37 on the side thereof opposite from the surface 36. The projections 37 thus separate a pair of relatively thin laterally extending portions 38. The end members, as at 22, may be defined as starter sections with one of the relatively thin portions 38 thereof having been eliminated.

Thus, it may be seen that any length of connector arrangement may be established by employing starter sections 22 at the ends thereof and one or more of the structures 21 therebetween. The planar surfaces 36 of the structures 21 and 22 are adapted to be placed in contact with one surface of the base plate member 20, with the structures 21 and 22 being secured to the base plate member as by any suitable means such as, for example, by means of screws, cementing or actually bonding the components together, as may be employed in the case of some forms of plastic. In any event, the various supporting structures 21 and 22, together with the base plate member 20, form a unitary base structure for retention of strip contact members, as will be hereinafter more fully described. It is to be noted that the structures 21 and 22 may be made as by extruding, casting or the like, with all of the structures 21 being identical, as are the structures 22.

Thus, by longitudinally abutting the relatively thin portions 38 of the supporting structures, affixing the structures to the base plate member 20, the entire unit thus formed becomes an integral, unitary entity.

Each of the structures 21 and 22 is provided with parallel, longitudinally extending, spaced primary grooves 40 that are generally rectangular in cross-section and formed in the planar lower surfaces 36. As shown primarily in Figs. 3 and 5, the projections 37 are provided with laterally extending elongated slots 41 that extend therethrough, there being secondary grooves 42 arranged on each side of the slots 41 with one of the ends of grooves 42 communicating with the primary grooves 40.

The base plate member 20 is provided with a plurality of spaced primary openings 43 therethrough, the purpose of which will be later described, while the laterally extending thin portions 38 of the structures 21 and 22 are provided with a plurality of secondary openings 44. In some instances, the openings 43 are aligned with the openings 44; however, in all instances the openings 43 and 44 are arranged in alignment and intersection with the primary grooves 40.

As shown primarily in Figs. 4 and 5, a plurality of strip connectors 50 are intimately confined in the primary grooves 40. The strip connectors 50 are provided with generally U-shaped contact portions 51 that are disposed within the secondary grooves 42 on each side of the slots 41. It is to be noted that the particular configuration of the U-shaped contact portions 51 is such as to spring bias the portions inwardly toward each other so as to enable proper pressure in engagement thereof with sides of the plates 23 and 24, retention of the plates therebetween and firm pressure contact between curved bulbous portions 52, of the contact portions 51 and the printed leads 30 carried by the boards 23 and 24. The strip connectors 50 may also be provided with pin type secondary contact portions 53 which extend in a direction opposite from the contacts 51. The contact portions 53 are formed by bending the material of the strip connectors 50 back upon themselves. The pin contact portions 53 extend outwardly from the connector through the openings 43 in the plate 20 and may thereafter be engaged by a standard plug 57 arrangement shown at 57. In other instances, the connectors 50 have contact portions 54, that are formed in a manner similar to the contact portions 53 and disposed therefrom in the same direction as the primary contact portions 51. The secondary contact portions 54 are disposed outwardly from the connector through the secondary openings 44 formed in the portions 38 of the structures 21 and 22. As shown in Figs. 3 and 5, the secondary contact portion 54, as formed from adjacently disposed strip connectors 50, may be interconnected or bridged by means of a bridging wire 55 that may be soldered thereto as at 56, Fig. 4.

Figure 9:
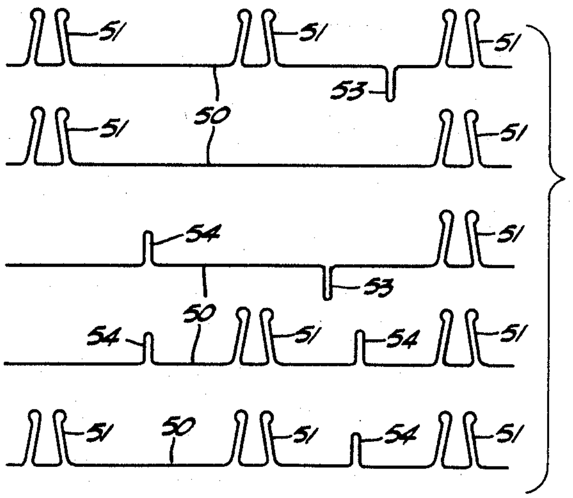
Fig. 9 is a generally diagrammatic view showing various configurations that may be assumed by the plurality of connector contact members utilized in the present device.
Figure 6:
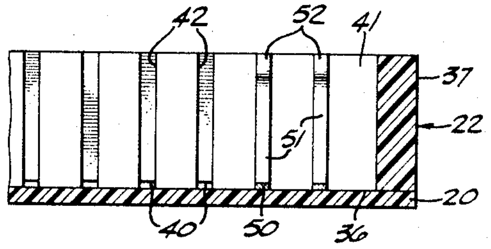
Fig. 6 is a fragmentary sectional view taken substantially as indicated by line 6—6, Fig. 4 and showing one portion of the primary contact portions with the circuit board omitted for clarity.
Figure 7:
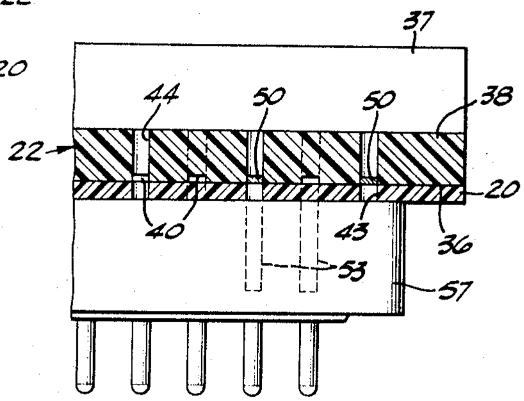
Fig. 7 is a fragmentary sectional view taken as indicated by line 7—7, Fig. 4 and showing the means by which a connector plug may be removably attached to the present device.
Figure 8:
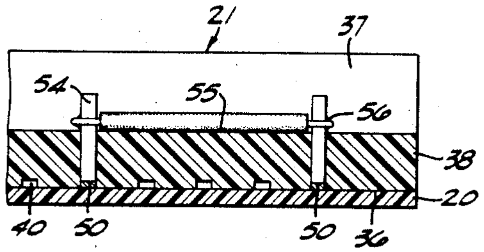
Fig. 8 is a still further fragmentary sectional view taken as indicated by line 8—8, Fig. 4 and showing means by which one of a plurality of strip connectors may be connected to another.

As shown in Fig. 9, the strip connectors 50 may assume a variety of shapes, as may be necessary to provide the desired interconnection between the circuit plates 23 and 24 and in conjunction with the necessity for pin type secondary contacts 53 or pin type secondary bridging contacts 54. In this connection, it is to be noted that the contact members 50 may be formed with one or more of the U-shaped primary contact portions 51, one or more of the pin type secondary contact portions 53 and one or more of the secondary pin type bridging contact portions 54. Thus, it may be seen that any desired interconnection as between two or more of the printed plates or boards 23 and 24 or others, may be provided. It is also to be noted that the number of parallel disposed strip connectors 50 may be utilized as desired for particular connectors, with the practical limit thereof being determined primarily by any difficulty that may be entailed in the physical insertion of the boards, as at 23 and 24, into the slots 41 and between the various contacts defined by the primary contact portions 51.

Figure 10:
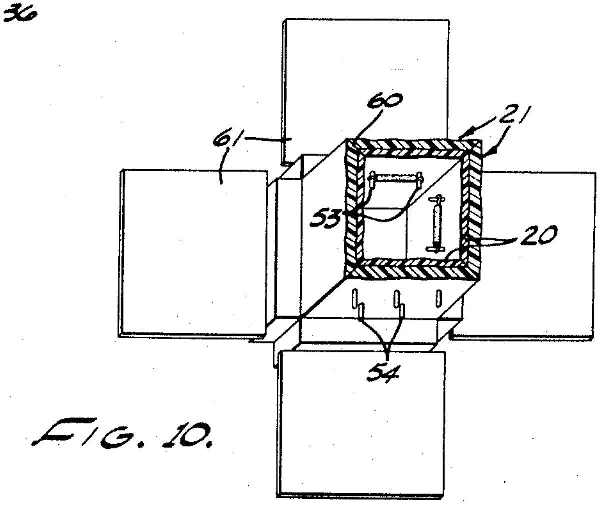
Fig. 10 is an isometric view showing a further application of the present invention.

As shown primarily in Fig. 10, a plurality of units, comprising the structures 21 mounted on plates 20, may be arranged in any desired manner, as by beveling the edges thereof as at 60, for example, and cementing or otherwise securing these units together. In this case, it may be seen that a plurality of printed circuit boards 61 may be disposed at various positions about the composite unit and that interconnection may be made between connector elements by means of the secondary connectors 53 with the secondary connectors 54 being utilized as pin type connectors engageable by a suitable plug or the like. This particular arrangement, as well as the forms of the invention shown and described hereinbefore, may be employed in a relatively small spaced envelope due to the nature of the particular connections employed and further due to the complete enclosure of the strip connector members 50.

It may thus be seen that various interconnections may be made with any number of printed circuit boards and that such boards may be removed from the connector as desired for replacement, testing and/or repair thereof.

In many assembly arrangements of electrical and electronic components, it is important that such a separable arrangement be provided, with the present device enabling the necessary pressure interconnections without the use of soldered or otherwise connected joints that would create the beforementioned disadvantages in electrical or electronic components in which they are utilized.

Having thus described the invention and the several modifications and embodiments thereof, it is desired to emphasize the fact that many further modifications and arrangements may be employed within the scope of the following claims.

It is claimed:

1. A circuit connector comprising, in combination: an insulating base plate member; insulating connector supporting structure disposed in contact with said plate member; a plurality of integral contact members, said contact members being formed from metallic strip material; contact member supporting projections extending from said supporting structure; spaced primary groove means in said supporting structure for intimately receiving said contact members; primary integral contact portions formed at spaced intervals along and extending from said contact members; secondary groove means in said projections and arranged substantially parallel to said primary groove means for receiving and maintaining adjacent primary contact portions in lateral spaced relationship; additional integral contact portions formed from said contact members and extending beyond outer surfaces of said plate member and said supporting structure; means for securing said insulating supporting structure on said insulating base plate member; and slot means formed in said projections substantially normal to and communicating with said primary and secondary groove means for reception and guidance of a circuit element, said primary contact portions being adapted for frictional disposition on surfaces of and separable engagement with circuit connector strips carried by said circuit element, said additional contact portions serving to permit electrical interconnection between one of said circuit elements with an adjacently disposed circuit element.

2. A circuit connector comprising, in combination: an insulating base plate; a plurality of insulating circuit supporting members disposed on said base plate; means for securing said supporting members to said base plate; a plurality of parallel primary grooves in surfaces of said supporting members adjacent said base plate; projections disposed outwardly from each of said supporting members; a transverse slot in each of said projections; a plurality of parallel secondary grooves arranged on each side of said slots, ends of said secondary grooves communicating with said primary grooves; a plurality of primary openings through said base plate, said openings being in alignment with said primary grooves; a plurality of secondary openings through said supporting members, said secondary openings being in alignment with said primary grooves; a plurality of integral, unitary strip contact members disposed in said primary grooves and intimately confined therein; primary generally U-shaped contact portions formed integrally from said contact members and adapted for disposition in pairs of secondary grooves on each side of said slots; and secondary integral contact portions extending through at least a portion of said primary and secondary openings to enable electrical connection thereto by other connector elements, said slots being adapted for reception and guidance of printed circuit plates, said primary contact portions being adapted for engagement with circuit strips carried by said circuit plates.

3. A circuit connector comprising, in combination: an insulating base plate; a plurality of insulating circuit supporting members disposed on said base plate; means for securing said supporting members to said base plate; a plurality of parallel primary grooves in surfaces of said supporting members adjacent said base plate; projections disposed outwardly from each of said supporting members; a transverse slot in each of said projections; a plurality of parallel secondary grooves arranged on each side of said slots, ends of said secondary grooves communicating with said primary grooves; a plurality of primary openings through said base plate, said openings being in alignment with said primary grooves; a plurality of secondary openings through said supporting members, said secondary openings being in alignment with said primary grooves; a plurality of integral, unitary strip contact members disposed in said primary grooves and intimately confined therein; primary generally U-shaped contact portions formed integrally from said contact members and adapted for disposition in pairs of secondary grooves on each side of said slots; and secondary integral contact portions, formed by bending of said contact members upon themselves, extending through at least a portion of said primary and secondary openings to enable electrical connection thereto by other connector elements, said slots being adapted for reception and guidance of printed circuit plates, said primary contact portions being adapted for engagement with circuit strips carried by said circuit plates.

4. A circuit connector comprising, in combination: an insulating base plate of relatively thin sheet material; a plurality of insulating circuit supporting members disposed on said base plate; means for permanently securing said supporting members in end to end relationship to said base plate; a plurality of generally rectangular parallel primary grooves in surfaces of said supporting members adjacent said base plate; integral projections disposed outwardly from each of said supporting members; a transverse slot in each of said projections; a plurality of parallel generally rectangular secondary grooves arranged on each side of said slots, ends of said secondary grooves communicating with said primary grooves; a plurality of primary openings through said base plate, said openings being in alignment with said primary grooves; a plurality of secondary openings through said supporting members, said secondary openings being in alignment with said primary grooves; a plurality of integral, unitary generally rectangular strip contact members disposed in said primary grooves and intimately confined therein; primary generally U-shaped contact portions formed integrally from said contact members and adapted for disposition in pairs of secondary grooves on each side of said slots; and secondary integral contact portions, formed by bending of said contact members upon themselves, extending through at least a portion of said primary and secondary openings to enable electrical connection thereto by other connector elements, said slots being adapted for reception and guidance of printed circuit plates, said primary contact portions being adapted for engagement with circuit strips carried by said circuit plates.

References Cited in the file of this patent

UNITED STATES PATENTS

| | | |
|---|---|---|
| 1,877,103 | Whiting | Sept. 13, 1932 |
| 2,312,181 | Matthews | Feb. 23, 1943 |
| 2,492,235 | Mitchell | Dec. 27, 1949 |
| 2,581,967 | Mitchell | Jan. 8, 1952 |
| 2,701,346 | Powell | Feb. 1, 1955 |
| 2,821,691 | Andre et al. | Jan. 28, 1958 |